United States Patent [19]

Shrock et al.

[11] Patent Number: 5,047,658

[45] Date of Patent: Sep. 10, 1991

[54] HIGH FREQUENCY ASYNCHRONOUS DATA SYNCHRONIZER

[75] Inventors: Eugene L. Shrock, Castle Rock; William K. Petty, Colorado Springs, both of Colo.

[73] Assignee: NCR Corporation, Dayton, Ohio

[21] Appl. No.: 532,005

[22] Filed: Jun. 1, 1990

[51] Int. Cl.⁵ .................. H03K 3/286; H03K 3/289
[52] U.S. Cl. .................... 307/269; 307/480; 307/443; 307/247.1
[58] Field of Search ............ 307/269, 443, 480, 272.1, 307/272.3, 247.1, 353; 328/63, 151; 375/4, 108, 118, 106, 111

[56] References Cited

U.S. PATENT DOCUMENTS

| Re. 32,945 | 6/1989 | Smithson | 307/269 |
|---|---|---|---|
| 3,091,737 | 5/1963 | Tellerman et al. | 307/480 |
| 3,471,790 | 10/1969 | Kaps | 307/269 |
| 3,751,683 | 8/1973 | Drost | 307/218 |
| 4,021,686 | 5/1977 | Zuk | 307/291 |
| 4,093,878 | 6/1978 | Paschal et al. | 307/291 |
| 4,417,155 | 11/1983 | Aizawa | 307/247 |
| 4,479,065 | 10/1984 | Aizawa | 307/247 |
| 4,575,644 | 3/1986 | Leslie | 307/291 |
| 4,578,599 | 3/1986 | Birch et al. | 307/291 |
| 4,591,737 | 5/1986 | Campbell | 307/272 |
| 4,797,838 | 1/1989 | Nelson et al. | 364/551.01 |
| 4,800,296 | 1/1989 | Ovens et al. | 307/291 |
| 4,820,939 | 4/1989 | Sowell et al. | 307/269 |
| 4,839,541 | 6/1989 | Gal et al. | 307/269 |
| 4,851,710 | 7/1989 | Grivna | 307/480 |
| 4,963,772 | 10/1990 | Dike | 307/480 |

FOREIGN PATENT DOCUMENTS

| 2842370 | 4/1980 | Fed. Rep. of Germany | 307/269 |
|---|---|---|---|
| 0092025 | 7/1980 | Japan | 307/269 |
| 0174811 | 8/1986 | Japan | 307/269 |
| 0202515 | 9/1986 | Japan | 307/269 |
| 0073913 | 3/1989 | Japan | 307/269 |
| 1075392 | 2/1984 | U.S.S.R. | 307/269 |

OTHER PUBLICATIONS

E. N. Hayes and M. A. Orr, "Synchronization of LSSD System Clocks to Asynchronous Signals", 01/1985, pp. 4934-4937.

T. S. Stafford "Circuit with Asynchronous Control and Synchronous Integrated Output" 11/1960, pp. 29-30.

*Primary Examiner*—Stanley D. Miller
*Assistant Examiner*—Sinh N. Tran
*Attorney, Agent, or Firm*—Wilbert Hawk, Jr.; Stephen F. Jewett; Jack R. Penrod

[57] ABSTRACT

A data synchronizer that operates at two to four times greater clock and data rates than previous data synchronizers. By using a positive feedback, self latching gate as the first memory element, rather than a cross-coupled device such as a flip-flop, such rates are attained without inducing metastable oscillation. The positive feedback, self latching gate is far less prone to metastable oscillation since it does not have two cross-coupled devices fighting each other to resolve the proper response to an input. Instead, the self latching gate latches up if a data HIGH is present during a clock HIGH, and remains LOW otherwise. External circuitry resets the self latching gate to the LOW state before the start of each clock HIGH cycle to remove any previous latched state. The self latching gate output is then synchronously sampled by a type D flip-flop to provide a completely synchronized data output.

16 Claims, 3 Drawing Sheets

HIGH FREQUENCY ASYNCHRONOUS DATA SYNCHRONIZER

BACKGROUND OF THE INVENTION

The present invention relates to an electronic digital circuit, and more particularly to a circuit for synchronizing high frequency, asynchronous data.

Most electronic data processing systems, at one point or another, must receive and assimilate asynchronous data signals, such as the signals from keyboard inputs, or asynchronous serial data ports. One known data synchronizer uses a type of AND gate to sample the asynchronous data at a data input with an edge (either leading or trailing) of a clock pulse. Each sample is, therefore, the binary product of the asynchronous input signal level and the clock edge level. Further, each binary product is subsequently stored in a flip-flop, until it is synchronously read by the remainder of the receiving system.

A common problem with this known type of data synchronizer is metastable oscillation which occurs in flip-flops and similar cross coupled devices when the asynchronous input signal is changing binary states at the same time that the clock edge is sampling the asynchronous input signal. In such a case, the resulting product may be a signal having an intermediate level that is too high to be considered a binary LOW state, and too low to be considered a binary HIGH state. The problem with an intermediate signal level is that one sampling gate could consider it a HIGH state, while another sampling gate could, at the same time, consider it a LOW state. On the other hand, the resulting product may be a signal that is too brief in duration to provide sufficient set-up time for sampling gates within a flip-flop or similar cross coupled device to properly respond. Both the intermediate signal and the brief signal are known to cause metastable oscillation if they are applied to a flip-flop or similar cross coupled device.

The usual solution to a metastable oscillation is to follow a first flip-flop with a second flip-flop in a dual stage circuit, e.g. a master-slave combination. In such a combination, the output data from the first flip-flop is transferred to the second flip-flop after a predetermined time delay which allows any metastable oscillation to die out to a valid data state within the master flip-flop before the data is switched to the slave flip-flop. However, the predetermined time delay of the usual data synchronizer is limited to a specific clock and data frequency for specific fabrication processes, and can become a bottleneck to higher frequency asynchronous data rates and higher frequency clock rates. Thus, there is a need for a data synchronizer that may be integrated using CMOS, TTL, LSTTL, etc. which synchronizes asynchronous data at higher clock and data rates for its respective fabrication process.

It is an object of the present invention to provide a data synchronizer that is substantially less sensitive to metastable oscillation.

It is another object of the invention to provide a data synchronizer that operates at a high clock frequencies and high asynchronous data rates without metastable oscillations.

SUMMARY OF THE INVENTION

According to one aspect of the invention, the foregoing objects are achieved by providing a synchronizer for synchronizing an input data signal with a clock signal. The synchronizer includes a device for providing a binary product at its device output. This binary product device has a first input which is connected to the input data signal and a second input which is connected to the clock signal. The synchronizer also includes a device for providing a binary sum signal at its output. This binary sum device has a first input which is connected to the output of the binary product device and a second input which is connected to its own binary sum output. This output-to-input connection provides positive feedback of the binary sum signal. A sampling device is also connected to the binary sum output for sampling and holding the binary sum signal. The sampling device has a sample input which is connected to the output of the binary sum device, a clock input which is connected to the clock signal and is responsive to a transition of the clock signal from binary LOW to binary HIGH to sample, hold and output the binary state of the sample input during the transition. Whereby the binary product device outputs a binary LOW if the input data signal is a binary LOW and the clock signal at that time is a binary HIGH, and a binary HIGH if the clock signal and the input data signal are HIGH concurrently. Furthermore, if the output of the binary product device is a binary HIGH, the binary sum device latches-up to a binary HIGH state which is sampled on a next transition of the clock signal from binary LOW to binary HIGH.

In accordance with another embodiment of the invention, the aforementioned objects are achieved by providing a synchronizer for synchronizing an input data signal with a clock signal. The synchronizer includes a device for providing a binary product at its output. This binary product device has a first input which is connected to the input data signal and a second input which is connected to the clock signal. A third input of the binary product device is connected to a device that delays and inverts the clock signal. The delaying and inverting device has an input which is connected to the clock signal and an output which is connected to the third input of the binary product device. The synchronizer also includes a device for providing a binary sum at its output. The binary sum device has a first input which is connected to the output of the binary product device and a second input which is connected to its own binary sum output. This output-to-input connection provides positive feedback of the binary sum signal. A sampling device is also connected to the binary sum output for sampling and holding the binary sum signal. The sampling device has a sample input which is connected to the output of the binary sum device, a clock input which is connected to the clock signal and is responsive to a transition of the clock signal from binary LOW to binary HIGH to sample, hold and output the binary state of the sample input during the transition. Whereby the binary product device outputs a binary LOW if the input data signal is a binary LOW at the same time that the clock signal is a binary HIGH and a signal at the output of the delaying and inverting device is also a binary HIGH. Furthermore, the binary product device outputs a binary HIGH if the clock signal, the output signal of the delaying and inverting device and the input data signal are HIGH concurrently. Also, if the output of the binary product device is a binary HIGH, the binary sum device latches-up to a binary HIGH state, and this binary HIGH state is sampled by the sampling device on a next transition of the clock signal from binary LOW to binary HIGH.

BRIEF DESCRIPTION OF THE DRAWINGS

While the specification concludes with the appended claims particularly pointing out and distinctly claiming the subject matter which is regarded as the invention, it is believed that the invention will be better understood from the following detailed description of the illustrative embodiments taken in conjunction with the accompanying drawings wherein like reference numbers indicate like parts, and in which:

DETAILED DESCRIPTION OF A PREFERRED EMBODIMENT

Figure 1:
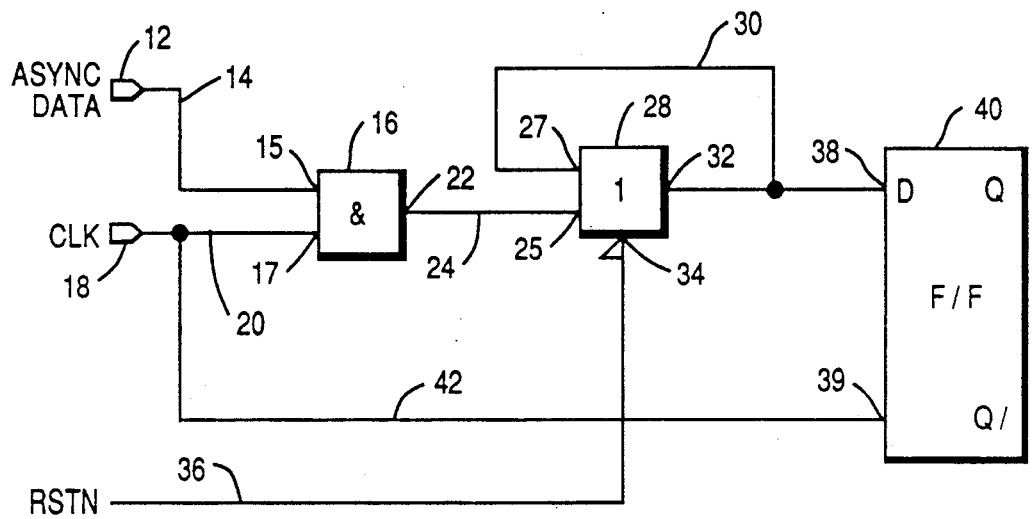
FIG. 1 is a block diagram of a data synchronizer according to the present invention.

Referring to FIG. 1, there is shown a block diagram of a data synchronizer 10 in accordance with the present invention. The data synchronizer 10 receives asynchronous data on terminal 12. Terminal 12 is connected via conductor 14 to one input 15 of AND gate 16. The data synchronizer 10 also receives a clock signal on terminal 18. This clock signal is the signal that the asynchronous data is being synchronized to. Terminal 18 is connected via conductor 20 to a second input 17 of AND gate 16. AND gate 16 is an asynchronous device, which means that the output signal is the immediate binary product of its inputs delayed only by an internal propagation delay. Synchronous circuit outputs, on the other hand, may be delayed for one-half to a full clock cycle before their binary results are clocked to their outputs. AND gate 16 performs a binary product operation which is a modulo-2 product of its inputs. Those skilled in the art will recognize that there are various ways of providing the binary product function using negative and positive logic, but positive logic with binary LOW equal to logic zero and binary HIGH equal to logic one will be assumed for the remainder of this description. Thus, AND gate 16 outputs a binary LOW if at least one of its inputs 15, 17 is a binary LOW, and a binary HIGH if both inputs 15, 17 are concurrently binary HIGHs.

AND gate 16 has an output 22 that is connected via a conductor 24 to one input 25 of a resettable OR gate 28, which has a second input 27 as will be explained below. Resettable OR gate 28 is another asynchronous device, and it provides an output sum signal that is a modulo-2 sum of the signals on its inputs 25, 27. As such, the output sum signal will be a binary LOW when inputs 25, 27 are driven LOW and the output sum will be HIGH if at least one of inputs 25, 27 is driven HIGH. Input 27 of resettable OR gate 28 is connected via a conductor 30 to its own output 32. The conductor 30 provides a positive feedback path for the resulting binary sum signal.

Ideally, resettable OR gate 28 has near infinite gain, which means that any input which is greater than the threshold level of a binary LOW would be quickly amplified to a binary HIGH. Resettable OR gate 28 with its positive feedback approaches the ideal gain of infinity. Such a high gain is not available in most flip-flops and/or cross coupled devices, which is a major contributor to metastable oscillations in such devices. In operation, if the output 22 of the AND gate 16 is a signal that is too low to be a full binary HIGH signal or a signal that is too brief to fulfill the set up requirement of a cross coupled device, resettable OR gate 28 will amplify such a signal to a full binary HIGH state.

An additional result of the positive feedback is that resettable OR gate 28 will very quickly latch itself up to binary HIGH if any signal greater than binary LOW is received from AND gate 16. This latching up stretches out any input pulse greater than binary LOW to a duration that is great enough to fulfill the set up requirements of a type D flip-flop. Since resettable OR gate 28 asynchronously latches up, it is necessary that it also be resettable, otherwise once latch up is attained, it would remain latched up for all subsequent clock cycles. Thus, resettable OR gate 28 is provided with a reset input 34 that asynchronously resets input 27 and output 32 to binary LOW when reset input 34 is driven by an asserted reset signal RSTN. In this embodiment, the reset input 34 is connected via a conductor 36 to the RSTN signal which is asserted when it is an active LOW.

The output of resettable OR gate 28 is connected to a data input 38 of a type D flip-flop 40. Type D flip-flop 40 also has a clock input 39 which is connected to the clock conductor 20 via a conductor 42. Type D flip-flop 40 samples the signal on its data input 38, i.e. the output signal of resettable OR gate 28, during every LOW-to-HIGH transition of the clock signal. Type D flip-flop 40 has a set up time requirement, which means that a data signal must be set to its desired binary state for a minimum period of time before the next HIGH-to-LOW clock signal transition occurs. Violation of the minimum set up time requirements may cause the type D flip-flop 40 to be in a metastable condition and internally oscillate. If type D flip-flop 40 were in a metastable condition when the LOW-to-HIGH transition occurred, then the data at the Q output could be erroneous. Thus, the benefit of the data amplification and the data stretching performed by resettable OR gate 28 that is placed before type D flip-flip 40 can be readily understood.

Figure 3:
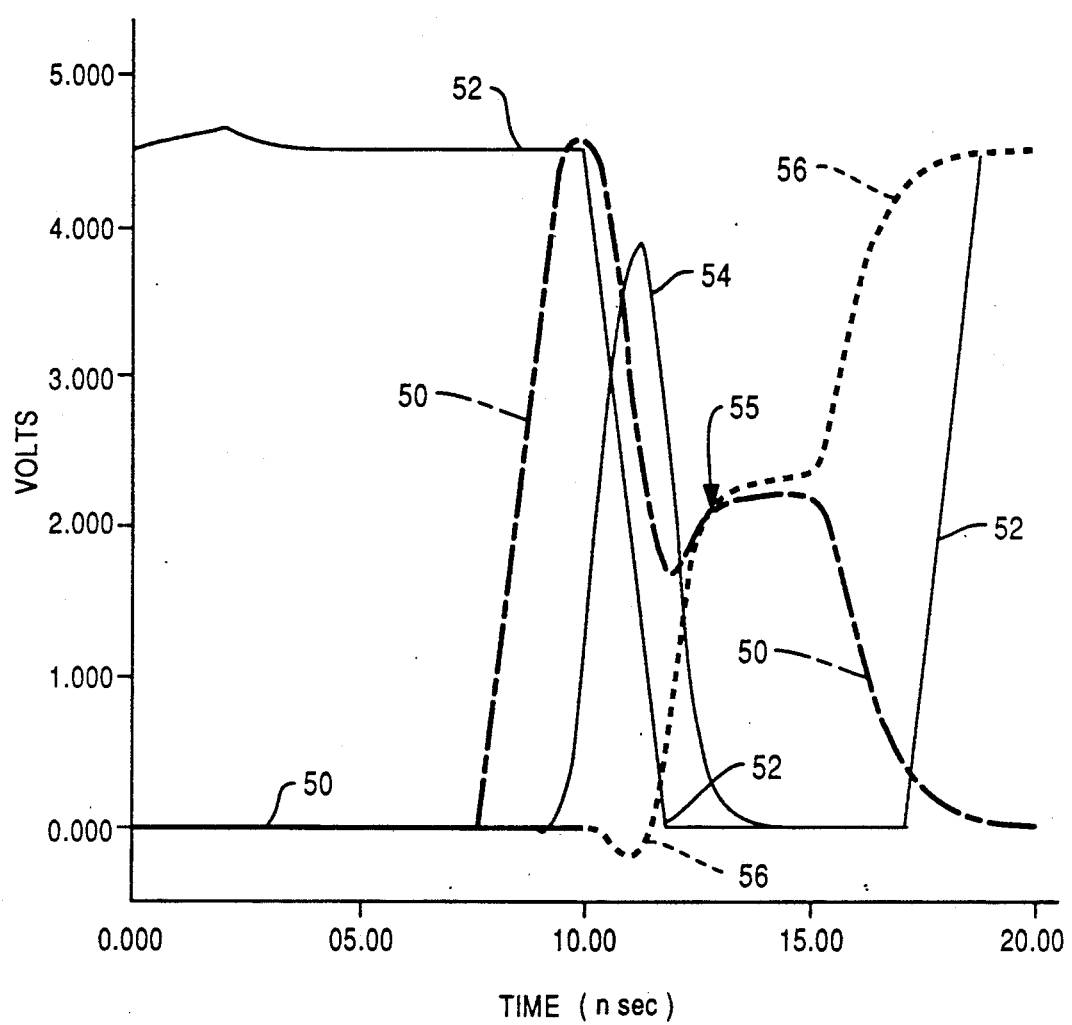
FIG. 3 shows various computer simulated plots of voltage versus time which are useful for understanding the invention.

Referring now to FIGS. 1 and 3, a computer simulation of the operation of the data synchronizer 10 under worst case conditions will be described. The data synchronizer 10 is configured to receive asynchronous data during a LOW-to-HIGH transition of the clock signal 52. FIG. 3 simulates a worst case condition because the asynchronous data signal 50 does not go HIGH until the clock signal 52 has almost completed its HIGH portion of the clock cycle. So, as the clock signal 52 starts its HIGH-to-LOW transition, the asynchronous data signal 50 is inputted via conductor 14 to the AND gate 16. This worst case of the change in the data signal 50 at the trailing edge of the clock signal 52 would induce metastable oscillations in flip-flops found in a typical data synchronizer. However, in the embodiment shown in FIG. 1, AND gate 16 receives the asynchronous signal 50 and the clock signal 52, and forms a binary product signal 54. The binary product signal 54 is below the minimum voltage level to be a binary HIGH, and is above the voltage level to be considered a binary LOW. Furthermore, because the binary product signal 54 is neither a binary HIGH nor a binary LOW, it also violates all of the set up minimums for a typical flip-flop. So the binary product signal 54 is also a worst case signal.

The binary product signal 54 is connected from AND gate output 22 to input 25 of resettable OR gate 28. Input 27 of resettable OR gate 28 is connected via conductor 30 to its output 32, which provides positive feedback for resettable OR gate 28. Assuming that resettable OR gate 28 is in the reset state, i.e. binary LOW, the initial response of resettable OR gate 28 is shown by a binary sum signal 56. Initially, the feedback is zero, and the binary sum signal 56 looks much like the binary product signal 54 after a propagation delay period. But, as the binary sum signal 56 increases, the positive feedback begins (at point 55) to quickly amplify the signal on input 27 up to the binary HIGH state. Thus, after the binary product signal 54 has died away, resettable OR gate 28 still stores in its output signal 56 a record of the brief asynchronous data signal 54. Moreover when the clock signal 52 transitions from LOW-to-HIGH, the binary sum output signal 56 will have been at the binary HIGH state sufficiently long to fulfill the minimum set up requirements of type D flip-flop 40 in order to prevent metastable oscillation when the sum output signal 56 is clocked through type D flip-flop 40.

In order to operate properly, the synchronizer 10 must be supplied with the reset active LOW signal RSTN. In this manner, any binary HIGH latched into the resettable OR gate 28 will be cleared in preparation for receiving the next bit of asynchronous data.

Figure 2:
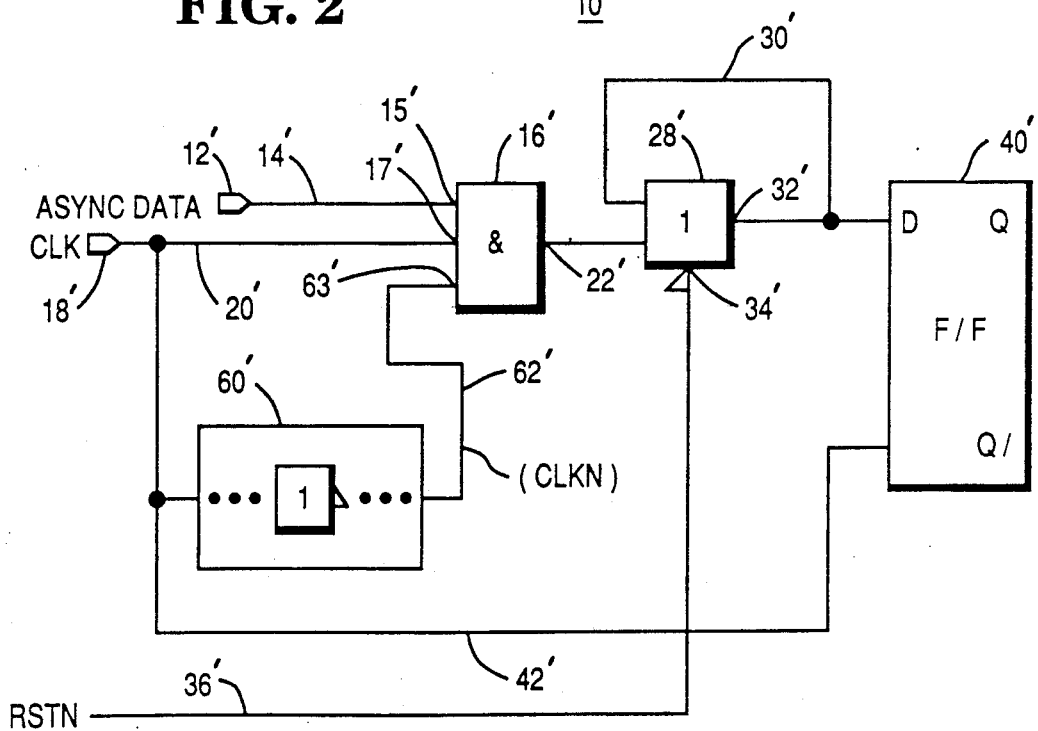
FIG. 2 is a block diagram of another data synchronizer according to the present invention.

Referring now to FIG. 2, another embodiment of the invention is shown. Data synchronizer 10' is very similar to data synchronizer 10 shown in FIG. 1, with the differences described below.

Data synchronizer 10' generates an additional clocking signal CLKN which is a delayed and inverted version of clock signal CLK. CLKN is derived from clock signal CLK by passing it through an odd number of inverters 60'. As is well known, each inverter delays the clock signal by one gate propagation delay, so propagation delays of one, three, five, etc. are available depending on the number of inverters 60'. Those skilled in the art will appreciate that other methods of effecting a delay such as a delay line or similar devices may be used, and such modifications are deemed to be within the scope of the present invention.

The delayed and inverted clock signal CLKN is connected via conductor 62' to a third input 63' of AND gate 16'. The result is that during the LOW state of clock signal CLK, delayed and inverted clock CLKN will be binary HIGH and the output of AND gate 16' will be a binary LOW regardless of the state of the asynchronous data signal. Just after the clock signal CLK has transitioned from LOW to HIGH, but before delayed and inverted clock CLKN has responded with its subsequent HIGH-to-LOW transition, the output of AND gate 16' will be enabled to follow the asynchronous data on input 15'. Once the delay period of the inverters 60' is over, delayed and inverted clock signal CLKN will transition from HIGH-to-LOW and AND gate output 22' again will be a binary LOW regardless of the asynchronous data signal. Thus, the combination of the clock signal CLK and delayed and inverted clock signal input CLKN operates to define a time window that opens with the LOW-to-HIGH transition of the clock signal CLK, and closes at the end of the delay period with the HIGH-to-LOW transition of delayed and inverted clock signal CLKN. The data synchronizer 10' samples the asynchronous data during the aforementioned time window, and at the end of the time window resettable OR gate 28' and type D flip-flop 40' have additional time for their input and output signals to stabilize when compared to their counterparts 28 and 40 shown in FIG. 1. Therefore, data synchronizer 10' has fewer timing considerations than data synchronizer 10 shown in FIG. 1. Data synchronizer 10, shown in FIG. 1, operates best when its duty cycle is less than 50 per cent, e.g. clock signals are LOW 60 per cent of the clock cycle and HIGH the remaining 40 per cent. Data synchronizer 10', on the other hand, will operate with clock signals that have variable duty cycles.

Figure 4:
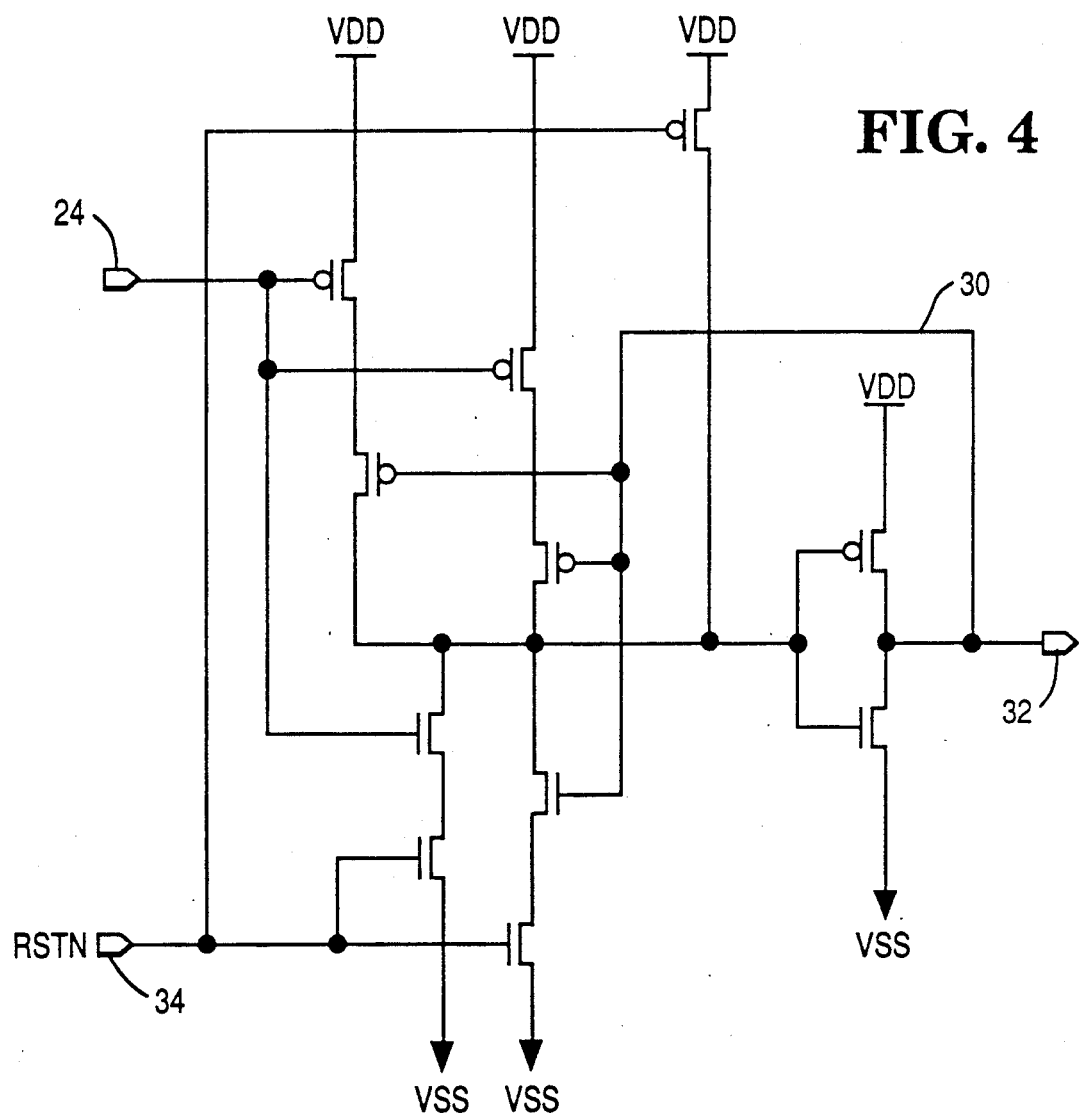
FIG. 4 is a schematic diagram of a CMOS design for a resettable two input OR gate with feedback which was used in the computer simulation.

FIG. 4 is a circuit diagram of a CMOS circuit diagram of a circuit used as resettable OR gate 28 to simulate the data synchronizer 10 and generate the voltage plots shown in FIG. 3. The circuit shown in FIG. 4 is currently providing a resettable OR function on a CMOS integrated circuit manufactured by NCR Corporation, Dayton, Ohio. Those skilled in the art of CMOS circuit design can readily discern the operation of the circuit shown in FIG. 4 without further explanation.

The type D flip-flops 40, and 40' shown in FIGS. 1 and 2 are type DFFRPF as shown in the VS 1500 standard cell library of NCR Corporation. Type DFFRPF is described in a book entitled NCR ASIC DATA BOOK 1989, copyright 1989 by NCR Corporation, Dayton, Ohio, the disclosure of which is hereby incorporated by reference. Furthermore, the simple CMOS gates used for the remainder of the gates shown in FIGS. 1 and 2 are standard, and are shown in chapter 1 of PRINCIPLES OF CMOS VLSI DESIGN, by Neil Weste and Kamran Eshraghian, copyright 1985, published by Addison-Wesley Publishing Company of Reading, Mass., the disclosure of which is also incorporated by reference.

Although high frequency CMOS fabrication process devices were used in the simulation and later manufacture of a data synchronizer according to the present invention, those skilled in the art will appreciate that other embodiments of the invention could be made using other fabrication processes such as NMOS, LSTTL, TTL, ECL, etc., and such modifications are deemed to be within the scope of the present invention.

Thus, it will now be understood that there has been disclosed a high frequency data synchronizer which provides synchronization of asynchronous data at clock and data rates at least a factor of two higher than the previous known synchronizers using the same fabrication process, without errors induced by metastable oscillations. While the invention has been particularly illustrated and described with reference to a preferred embodiment thereof, it will be understood by those skilled in the art that various changes in form, details, and applications may be made therein. It is accordingly intended that the appended claims shall cover all such changes in form, details and applications which do not depart from the true spirit and scope of the invention.

What is claimed as new and desired to be secured by Letters Patent of the United States is:

1. A synchronizer for synchronizing an input data signal with a clock signal, comprising:
   means for providing a binary product at an output thereof, said binary product means having a first input connected to said input data signal and a second input connected to said clock signal;
   means for providing a binary sum at an output thereof, said binary sum means having a first input connected to said output of said binary product means and a second input connected to said output of said binary sum means thereby providing positive feedback; and sampling means for sampling and holding said output of said binary sum means;

said sampling means having a sample input connected to said output of said binary sum means, and a clock input connected to said clock signal and responsive to a transition of said clock signal from a binary LOW to a binary HIGH to sample and hold the binary state of said sample input during such transition;

whereby said binary product means outputs a binary LOW if said input data signal is a binary LOW at the same time that said clock signal is a binary HIGH, and a binary HIGH if said clock signal and said input data signal are HIGH concurrently, and if the output of the binary product means is a binary HIGH, the binary sum means latches-up to a binary HIGH condition that is sampled as the clock signal subsequently transitions from a binary LOW to a binary HIGH.

2. A synchronizer according to claim 1, wherein said clock signal is a binary LOW during each clock cycle longer than said clock signal is a binary HIGH.

3. A synchronizer according to claim 2, wherein said binary sum means has a reset control input responsive to a reset signal.

4. A synchronizer according to claim 3 wherein said binary product means is a high frequency CMOS AND gate, said binary sum means is a CMOS resettable OR gate, and said sampling means is a CMOS edge triggered, type D flip-flop 5. A synchronizer for synchronizing an input data signal with a clock signal, comprising:

means for providing a binary product at an output thereof, said binary product means having a first input connected to said input data signal, a second input connected to said clock signal and a third input;

means for delaying and inverting said clock signal having an input connected to said clock signal and an output connected to said third input of said binary product means;

means for providing a binary sum at an output thereof, said binary sum means having a first input connected to said output of said binary product means and a second input connected to said output of said binary sum means thereby providing positive feedback; and sampling means for sampling and holding said output of said binary sum means;

said sampling means having a sample input connected to said output of said binary sum means, a clock input connected to said clock signal and is responsive to a transition of said clock signal from a binary LOW to a binary HIGH to sample and hold the binary state of said sample input during such transition;

whereby said binary product means outputs a binary LOW if said input data signal is a binary LOW during the period that said clock signal is a binary HIGH and a signal at the output of said delaying and inverting means is a binary HIGH; and outputs a binary HIGH if said clock signal, said output signal of said delaying and inverting means and said input data signal are HIGH concurrently; and if the output of the binary product means is a binary HIGH, the binary sum means latches-up to a binary HIGH condition that is sampled as the clock signal transitions from a binary LOW to a binary HIGH.

6. A synchronizer according to claim 5, wherein said binary sum means has a reset control input responsive to a reset signal.

7. A synchronizer according to claim 6 wherein said binary product means is a high frequency CMOS AND gate, said binary sum means is a high frequency CMOS resettable OR gate, and said sampling means is a high frequency CMOS edge triggered, type D flip-flop.

8. A circuit apparatus for converting asynchronous data into synchronous data, comprising:

a clock signal having a HIGH portion and an LOW portion, said clock signal duty cycle that is less than 50 per cent;

an asynchronous data signal having a HIGH portion which partially overlaps said clock signal HIGH portion;

means for forming a binary product, said binary product means having a first input and a second input connected to said clock signal and said asynchronous data signal respectively, and an output;

means for the asynchronous latching of a binary HIGH if said binary product means output is a binary HIGH connected at a first input to said binary product means output, said asynchronous latching means having an output;

means responsive to a negative going edge of a reset signal for resetting said asynchronous latching means; and sampling means coupled to said asynchronous latching means and said clock signal for synchronously sampling and holding the binary level of said asynchronous latching means output during a negative going edge of said clock signal such that an output signal of said sampling means is data that corresponds to the asynchronous data carried by said asynchronous data signal that is synchronized to said clock signal.

9. A circuit apparatus for converting asynchronous data into synchronous data according to claim 8, further comprising:

delay and inverting means for delaying and inverting said clock signal having an input connected to said clock signal and an output connected to a third input of said binary product means.

10. A circuit apparatus for converting asynchronous data into synchronous data according to claim 8, wherein said binary product means is a high frequency CMOS AND gate, said asynchronous latching means is a high frequency CMOS RESETTABLE OR gate with its output fed back to one of its inputs, and said sampling means is a high frequency, type D flip-flop.

11. A circuit apparatus for converting asynchronous data into synchronous data according to claim 9, wherein said binary product means is a high frequency CMOS AND gate, said asynchronous latching means is a high frequency CMOS RESETTABLE OR gate with its output fed back to one of its inputs, and said sampling means is a high frequency, type D flip-flop.

12. A circuit apparatus for converting an asynchronous data signal into a synchronous data signal, comprising:

a clock signal having an ON portion and an OFF portion;

an asynchronous data signal having an ON portion which partially overlaps said clock signal ON portion;

inverting delay means for inverting and delaying said clock signal connected to said clock signal and having an output;

means for forming a binary product, said product means having a first, second and third inputs connected to said asynchronous data signal, said clock signal and said inverted delay means output respectively, said binary product means being capable of outputting a binary HIGH during the time that the clock signal goes HIGH and the output of the inverted delay means goes LOW, and an output;

means for the asynchronous latching of a binary HIGH whenever said product means output is a binary HIGH connected at a first input to said binary product output, said asynchronous latching means having an output;

means for resetting said asynchronous latching means connected to said asynchronous latching means; and sampling means coupled to said asynchronous latching means and said clock signal for synchronously sampling and holding the binary level of said output during each negative going edge of said clock signal, said sampling means having an output;

whereby the synchronized data signal that corresponds to information in the asynchronous data signal is outputted at said output of said sampling means.

13. The circuit apparatus according to claim 12, wherein said asynchronous latching means is an OR gate having a plurality of inputs and an output, and said OR gate output is connected to one of said plurality of inputs of said OR gate.

14. The circuit apparatus according to claim 13, wherein said sampling means is a type D flip-flop.

15. The circuit apparatus according to claim 14, wherein said means for forming a binary product is an AND gate.

16. The circuit apparatus according to claim 15, wherein all circuit components are part of a high frequency CMOS integrated circuit.

* * * * *